(12) United States Patent
Wallrafen (10) Patent No.: US 8,174,097 B2
(45) Date of Patent: May 8, 2012

(54) ELECTRIC SUB-ASSEMBLY

(75) Inventor: Werner Wallrafen, Hofheim (DE)

(73) Assignee: Continental Automotive GmbH, Hannover (DE)

( * ) Notice: Subject to any disclaimer, the term of this patent is extended or adjusted under 35 U.S.C. 154(b) by 1471 days.

(21) Appl. No.: 11/574,455

(22) PCT Filed: Aug. 25, 2005

(86) PCT No.: PCT/EP2005/054189
§ 371 (c)(1),
(2), (4) Date: Feb. 28, 2007

(87) PCT Pub. No.: WO2006/024626
PCT Pub. Date: Mar. 9, 2006

(65) Prior Publication Data
US 2008/0310120 A1 Dec. 18, 2008

(30) Foreign Application Priority Data
Aug. 31, 2004 (DE) .................. 10 2004 042 488

(51) Int. Cl.
*H01L 23/495* (2006.01)
(52) U.S. Cl. .................. 257/675; 257/696; 257/E23.07; 174/555; 361/711
(58) Field of Classification Search .................. 257/666, 257/675, 668, 706, 713, 796, E23.103, E23.106, 257/E23.109, E23.07
See application file for complete search history.

(56) References Cited

U.S. PATENT DOCUMENTS

| | | | |
|---|---|---|---|
| 4,807,018 A * | 2/1989 | Cellai | 257/675 |
| 5,521,785 A | 5/1996 | Schmidt et al. | 361/720 |
| 5,740,002 A | 4/1998 | Jenss et al. | 361/93 |
| 5,770,973 A | 6/1998 | Fujisawa et al. | 330/289 |
| 5,831,835 A | 11/1998 | Dirmeyer et al. | 361/818 |
| 2001/0002160 A1 | 5/2001 | Bookhardt et al. | 361/704 |
| 2003/0153128 A1 | 8/2003 | Ito | 438/122 |
| 2004/0159919 A1 | 8/2004 | Doi et al. | 257/676 |
| 2005/0180116 A1 | 8/2005 | Yamanaka | 361/718 |

FOREIGN PATENT DOCUMENTS

| | | |
|---|---|---|
| DE | 3940933 A1 | 12/1989 |
| DE | 4031051 A1 | 5/1991 |
| DE | 2418954 | 10/1994 |
| DE | 4327335 A1 | 2/1995 |

(Continued)

OTHER PUBLICATIONS

PCT International Search Report, PCT/EP2005/054189, 6 pgs, Oct. 20, 2006.

*Primary Examiner* — David Vu
*Assistant Examiner* — Earl Taylor
(74) *Attorney, Agent, or Firm* — King & Spalding L.L.P.

(57) ABSTRACT

An electric sub-assembly has an integrated circuit, which contains at least one power semi-conductor component and additional electronic components, the latter being interconnected and linked to connections by the conductors of a lead frame (1, 2, 3). The lead frame (1, 2, 3) has at least one cooling surface (3), which is connected in a thermally conductive manner to a thermal contact (4) of the integrated circuit or circuits. The cooling surface has a greater surface area than the thermal contact surface (4) of the integrated circuit or circuits and is wider than the parts (1) of the lead frame that are used as electric conductors.

24 Claims, 7 Drawing Sheets

FOREIGN PATENT DOCUMENTS

| | | |
|---|---|---|
| DE | 4327584 A1 | 2/1995 |
| DE | 4419005 A1 | 12/1995 |
| DE | 4430798 A1 | 7/1996 |
| DE | 10085252 T1 | 5/2001 |
| DE | 20316199 U1 | 5/2004 |
| DE | 10334761 A1 | 8/2004 |
| GB | 1255073 | 5/1969 |
| GB | 1285735 | 10/1969 |

\* cited by examiner

ELECTRIC SUB-ASSEMBLY

CROSS-REFERENCE TO RELATED APPLICATIONS

This application is a U.S. national stage application of International Application No. PCT/EP2005/054189 filed Aug. 25, 2005, which designates the United States of America, and claims priority to German application number DE 10 2004 042 488.8 filed Aug. 31, 2004, the contents of which are hereby incorporated by reference in their entirety.

TECHNICAL FIELD

The invention relates to an electrical assembly comprising an integrated circuit, which has at least one power semiconductor element and further electronic components, which are connected to one another and to connections by conductors formed by a leadframe.

BACKGROUND

Electrical assemblies, which are to operate reliably and must be robust in relation to ambient influences, are often realized with the aid of leadframe structures to which active and passive electrical and electronic components are applied by welding. The assemblies are encapsulated with electrically insulating materials, so that they are hermetically sealed in relation to ambient influences and can withstand even large mechanical loadings (impact, vibration). Examples of such assemblies are rotational speed sensors or position sensors in motor vehicles.

When using power semiconductor elements, in particular field effect transistors, occasionally large power losses arise, however, which are difficult to dissipate in the case of the assemblies described.

SUMMARY

It is an object of the present invention to configure an electrical assembly according to the preamble in such a way that, whilst maintaining the positive properties and with minimum additional costs, good heat dissipation is possible and a construction by way of printed circuit board assemblies (epoxy printed circuit boards or ceramic boards using SO technology) with separate cooling elements is avoided.

In the case of the assembly according to an embodiment, this object is achieved by virtue of the fact that the leadframe has at least one cooling area, which is thermally conductively connected to a thermal contact area of the at least one integrated circuit, which has a larger area than the thermal contact area of the at least one integrated circuit and which is wider than the parts of the leadframe which are used for electrical conduction.

Thus, according to an embodiment, an electrical assembly may comprise an integrated circuit, which has at least one power semiconductor element and further electronic components, which are connected to one another and to connections by conductors formed by a leadframe, wherein the leadframe has at least one cooling area, which is thermally conductively connected to a thermal contact area of the at least one integrated circuit, which has a larger area than the thermal contact area of the at least one integrated circuit and which is wider than the parts of the leadframe which are used for electrical conduction, and wherein the cooling area is formed as a thermal contact plate with a connection lug, which is bent away from its plane at its end remote from the integrated circuit and at which one end of the contact area bears and is thermally conductively connected, wherein the thermal contact plate is injection-molded or cast into a component composed of an electrically insulating material, wherein the component has a receptacle, into which the integrated circuit can be inserted in a manner positioned in such a way that connection lug and mating connection lug bear on one another and signal connection lugs and signal mating connection lugs bear on one another.

BRIEF DESCRIPTION OF THE DRAWINGS

The invention permits numerous embodiments. A plurality of these embodiments are illustrated schematically in the drawing on the basis of a plurality of figures and are described below. In the figures.

DETAILED DESCRIPTION

According to an embodiment, the leadframe is preferably stamped out in one piece from a metal sheet. Parts of the leadframe serve for electrical connection, and other parts serve for cooling. According to an embodiment, the thermal connection between the contact area and the cooling area can be effected in various ways, for example by conductive adhesive, by welding or soldering. However, it is also possible for a spring-elastic clamping to be provided. According to an embodiment, the cooling area may in particular cases be connected to the ground or the negative pole of the operating voltage source.

In order to obtain a good thermal contact, in one embodiment of the assembly it is provided that the cooling area is fixedly connected to the contact area at least two opposite edges, and that the area region of the cooling area that bears on the contact area is prestressed against the contact area. It is assumed in this case that the thickness of the cooling plate is smaller than the thickness of the metal body of the integrated circuit that forms the contact area.

One advantageous configuration of the assembly consists in the fact that the assembly including the leadframe is encapsulated with an electrically insulating material. According to an embodiment, the assembly can be brought into contact with cooling air.

In order in this case to ensure a good heat dissipation from the cooling area to the surrounding medium, however, in this configuration it may be provided that the cooling area is at least partially not encapsulated, or that the cooling area is at least partially encapsulated with a thinner layer than the remaining parts of the assembly.

Another embodiment enables a universal use of the assembly by virtue of the fact that the further electronic components form an application specific integrated circuit.

Moreover, in the case of the assembly according to an embodiment it may be provided that a sensor, in particular a position detecting sensor, is connected with the aid of the conductors formed by the leadframe.

According to an embodiment, a particularly compact assembly is obtained by the application specific integrated circuit and the integrated circuits being integrated in a common housing.

Furthermore, the fact that the leadframe is mounted in an electrically insulating holding frame contributes to the stability in the manufacturing process, according to an embodiment.

For electrical connection to other assemblies and apparatuses, in accordance with one embodiment, it may be provided that parts of the leadframe are embodied as electrical plug connections.

In order to improve the heat dissipation, it may furthermore be provided that a thermally conductive intermediate layer is applied between the contact area and the region of the leadframe that touches said contact area, according to an embodiment.

If the cooling area is formed as a thermal contact plate with a connection lug, which is bent away from its plane at its end remote from the integrated circuit and at which one end of the contact area bears and is thermally conductively connected, then both simple mountability of the integrated circuit and simple diagnosis in the event of a defect of the assembly are possible.

Said simple mountability is also improved if the contact area has a mating connection lug, which bears on the connection lug of the thermal contact plate and is thermally conductively connected to the connection lug, according to an embodiment.

A welding may be effected e.g. in a simple manner after the completion of the component of the assembly, according to an embodiment.

According to an embodiment, the same advantages are furthermore achieved if the leadframe has signal-carrying conductors having signal connection lugs, which are bent away from their plane at their ends facing the integrated circuit and at which ends the signal-carrying conductors bear and are electrically conductively connected, and if the ends of the signal-carrying conductors have signal mating connection lugs, which bear and are electrically conductively connected at the signal connection lugs.

Both good thermal conduction and good electrical conduction are achieved by virtue of the fact that the connection lug is connected to the mating connection lug and/or the signal connection lugs are connected to the signal mating connection lugs by welding such as electrical resistance welding or laser welding or by soldering, according to an embodiment.

Good thermal conduction can be achieved in a simple manner also by virtue of the fact that the connection lug is connected to the mating connection lug by means of electrically and/or thermally conductive adhesive, according to an embodiment.

For good electrical conduction, in a simple manner, the signal connection lugs may be connected to the signal mating connection lugs by means of an electrically conductive adhesive, according to an embodiment.

If the thermal contact plate is injection-molded or cast into a component composed of an electrically insulating material, wherein the component has a receptacle, into which the integrated circuit can be inserted in a manner positioned in such a way that connection lug and mating connection lug bear on one another and signal connection lugs and signal mating connection lugs bear on one another, then as a result of the integrated circuit being inserted into the receptacle, at the same time connection lugs and mating connection lugs and also signal connection lugs and signal mating connection lugs bear on one another in a correctly assigned manner, which significantly simplifies the mounting operation, according to an embodiment.

For conductive connection, a good accessibility e.g. for welding is achieved if connection lug and mating connection lug and/or signal connection lugs and signal mating connection lugs are bent away in a manner directed away from the plane of a bottom of the receptacle, according to an embodiment.

If the thermal contact plate is injection-molded or cast into the component composed of electrically insulating material in such a way that at least 50% of the area of the contact plate is covered with a wall thickness of the electrically insulating material of <3 mm, in particular of <1.5 mm, then good heat dissipation from the thermal contact plate via the component composed of electrically insulating material is achieved in conjunction with good stability of the assembly, according to an embodiment.

If the signal-carrying conductors of the leadframe are injection-molded or cast into the component composed of electrically insulating material, and the integrated circuit can be inserted into the receptacle in a manner positioned in such a way that mutually assigned signal connection lugs and signal mating connection lugs bear on one another, then a simple exact positioning of the signal connection lugs with respect to the signal mating connection lugs during mounting is possible in this case, too, according to an embodiment.

For further dissipation of the heat generated by the integrated circuit, according to an embodiment, the integrated circuit may bear with a boundary wall on the bottom of the receptacle, in which case preferably the component composed of electrically insulating material has a wall thickness of <4 mm, in particular of <2 mm, in the region of the bottom of the receptacle. The smaller the wall thickness, the better the heat dissipation capability to the ambient air.

In this case, according to an embodiment, the integrated circuit may bear on the bottom of the receptacle via an intermediate layer.

For good heat transfer, it is possible for the intermediate layer to comprise a thermally conductive adhesive, a thermally conductive adhesive film or a thermally conductive paste, according to an embodiment.

If the thermal contact plate is provided with a cutout or a plurality, in particular a multiplicity of continuous cutouts in its region enclosed by the electrically insulating material, according to an embodiment, then an at least largely reliable bearing of the contact plate on the plastic is achieved, even in the event of temperature change, by means of the electrically insulating material filling the cutouts. Delaminations between these parts which might occur after a temperature change and might lead to an insulating layer of air between said parts are thus avoided in a simple manner.

According to an embodiment, the integrated circuit may be a plastic-encapsulated power semiconductor element or a hybrid circuit that is arranged on a substrate and has power semiconductor elements.

In this case, according to an embodiment, the substrate is preferably a ceramic substrate or an insulated metal substrate or an epoxy printed circuit board, on which the power semiconductor element and electronic components are arranged, in particular soldered or in particular thermally conductively adhesively bonded.

Figure 1:
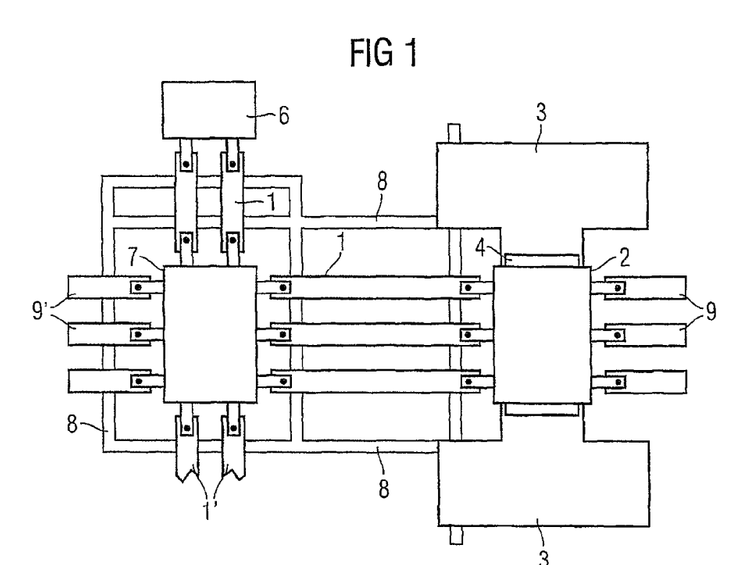
FIG. 1 shows a first view of an exemplary embodiment.
Figure 2:
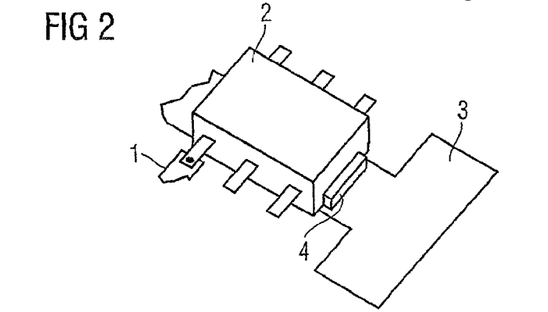
FIG. 2 shows a second view of parts of the exemplary embodiment according to FIG. 1,
FIG. 3 and FIG. 4 each show a cross section through a part of an exemplary embodiment in which, as a result of prior bending of the cooling area, a good thermal contact is obtained in a first phase during production and in the finished state.

In the exemplary embodiment according to FIGS. 1 and 2, conductors 1 of a leadframe connect a structural unit which is formed as an integrated circuit and comprises a plurality of power semiconductor elements 2 to an application specific integrated circuit 7 and a sensor 6. Further conductors of the leadframe are led out from the assembly and serve as connection pins 9, 9'. A wider conductor of the leadframe is extended areally and forms a cooling area 3, which is in thermal contact with a thermal contact area 4 of the integrated circuit 2. The connection pins 9 serve for connection to a motor, preferably via interference-suppression inductors, which are not illustrated in FIG. 1. The conductors 1' illustrated as broken off are intended to show that other components may additionally be present in the assembly according to an embodiment.

During production, a leadframe is firstly produced as one piece. Bridges present between the individual conductors 1, 1' are separated later. As a result, the leadframe can be handled as one piece up to a definition of the conductors. The separation is effected only when the individual conductors have been fixed, which is effected by a holding frame 8 in the exemplary embodiment according to FIG. 1. A final fixing is effected when the entire assembly is encapsulated with electrically insulated material.

Figure 3:
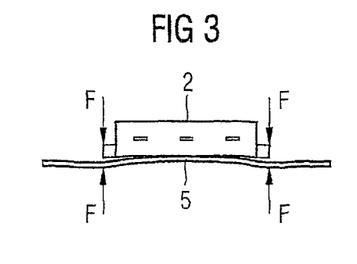
Figure 4:
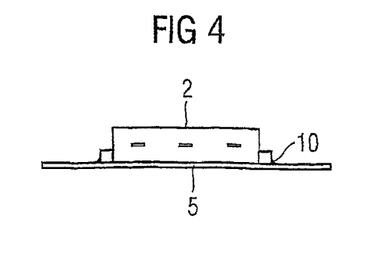

In the exemplary embodiment according to FIG. 3, an area region 5 of a conductor of the leadframe is pre-bent on that area which is intended to touch the contact area 4 of the power semiconductor element 2. During mounting, the area region 5 is pressed onto the contact area 4 and fixed there for example by means of a soldering or welding seam 10 or by suitable clips. By means of the prestress, the conductor bears fixedly on the entire contact area 4 in the area region 5.

Figure 5:
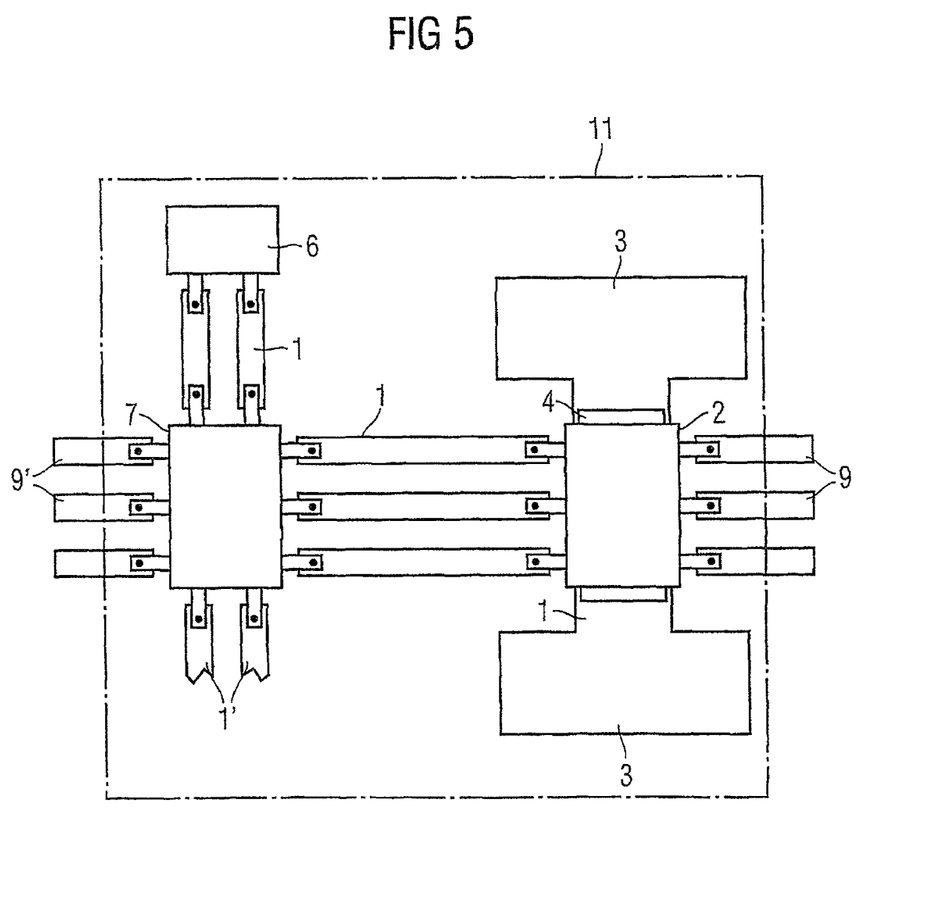
FIG. 5 shows an exemplary embodiment with an encapsulation composed of plastic.
Figure 6:
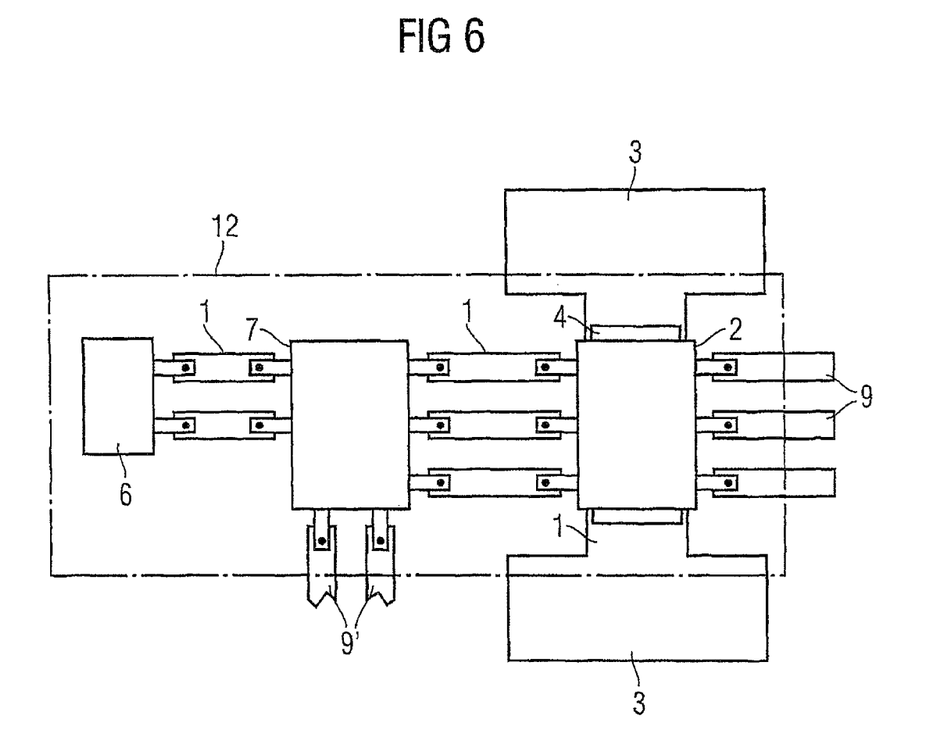
FIG. 6 shows a further exemplary embodiment with an encapsulation.

The exemplary embodiment according to FIG. 5 has an encapsulation 11, which also encompasses the cooling area 3 and is illustrated in transparent fashion in order to provide a clear view of the components and conductors. In order to obtain higher heat dissipation, the cooling areas 3 are not enclosed by the encapsulation 12 in the case of the exemplary embodiment according to FIG. 6.

Figure 7:
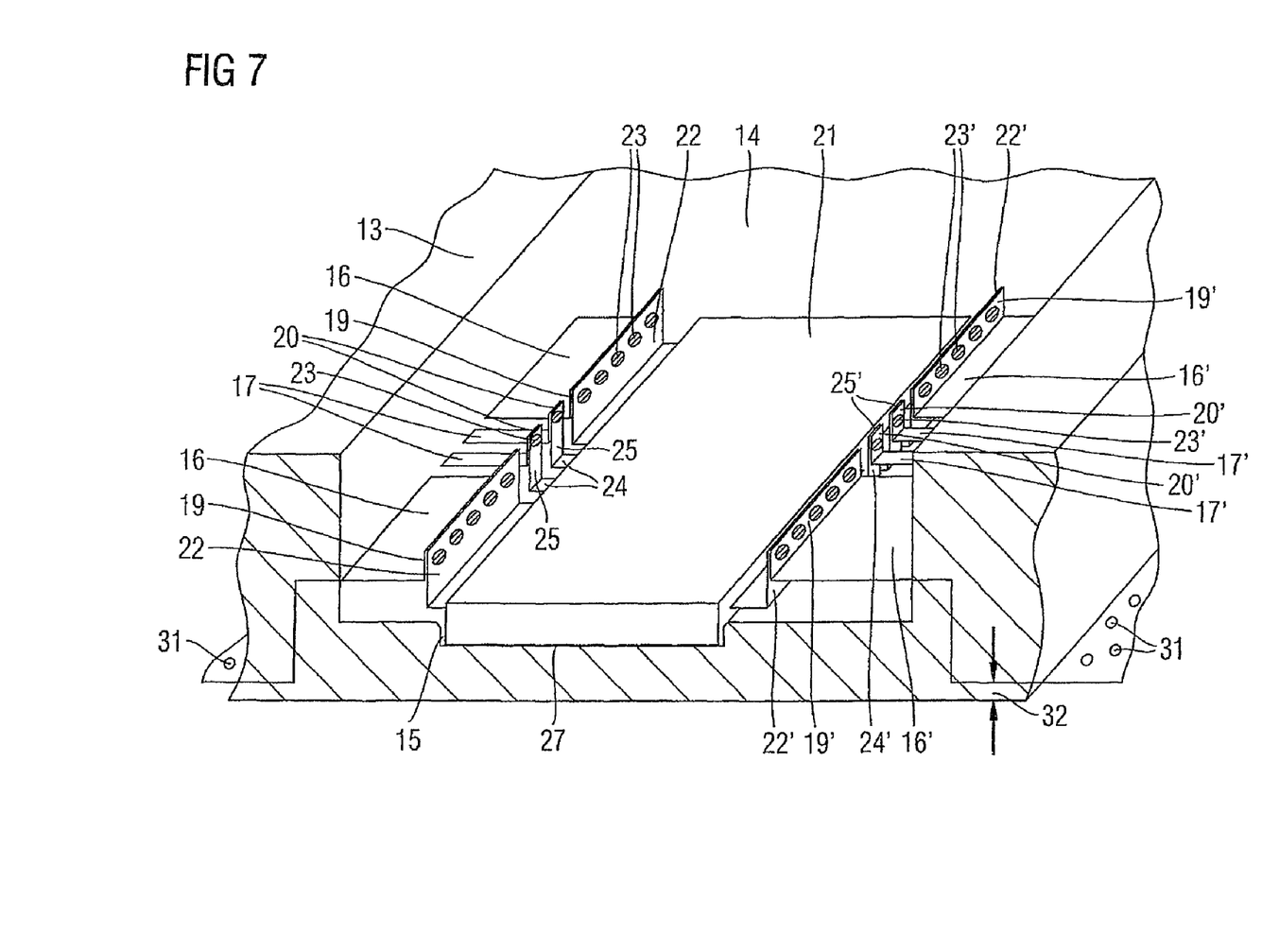
FIG. 7 shows a perspective view of a further exemplary embodiment.
Figure 8:
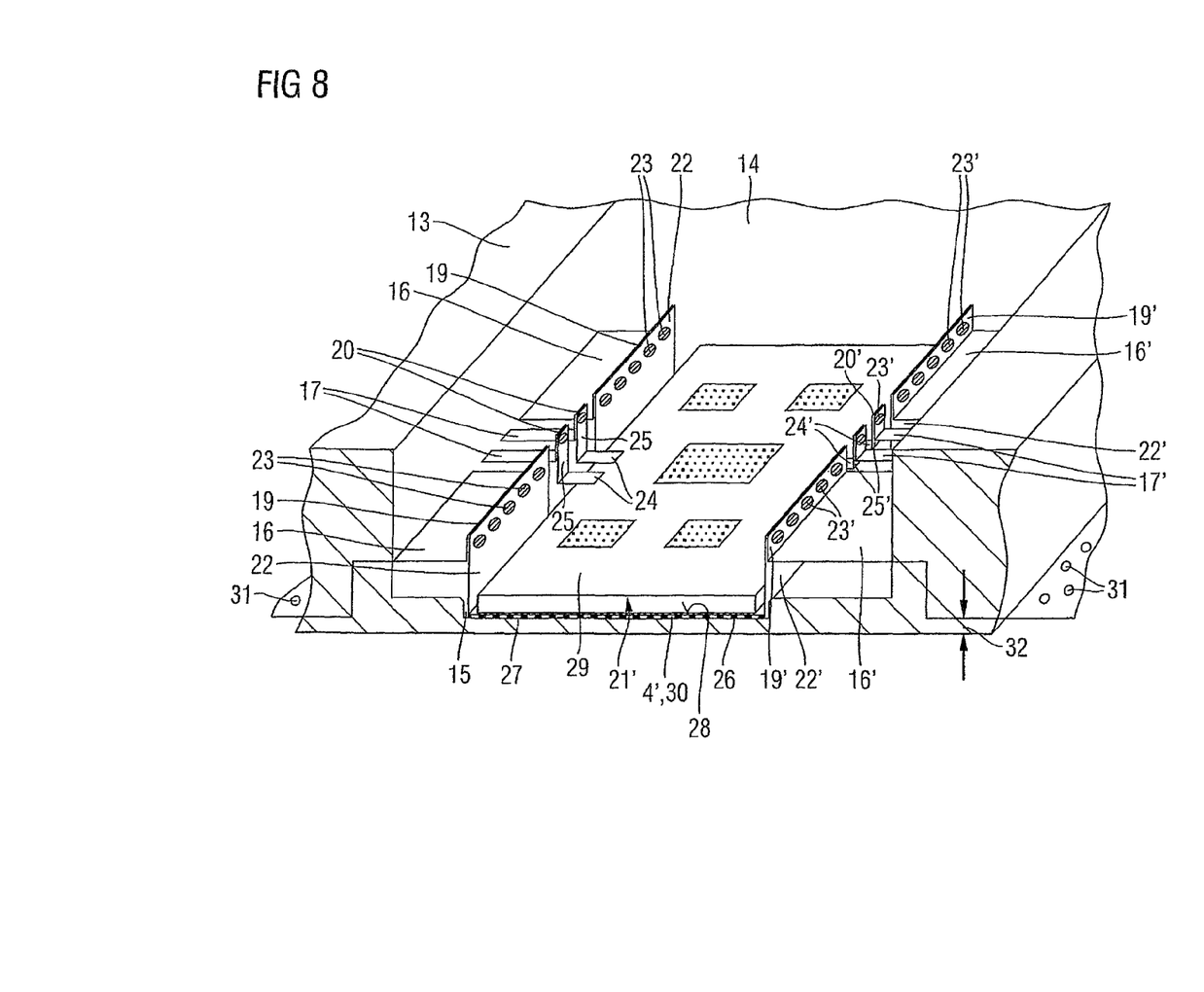
FIG. 8 shows a perspective view of a further exemplary embodiment.
Figure 9:
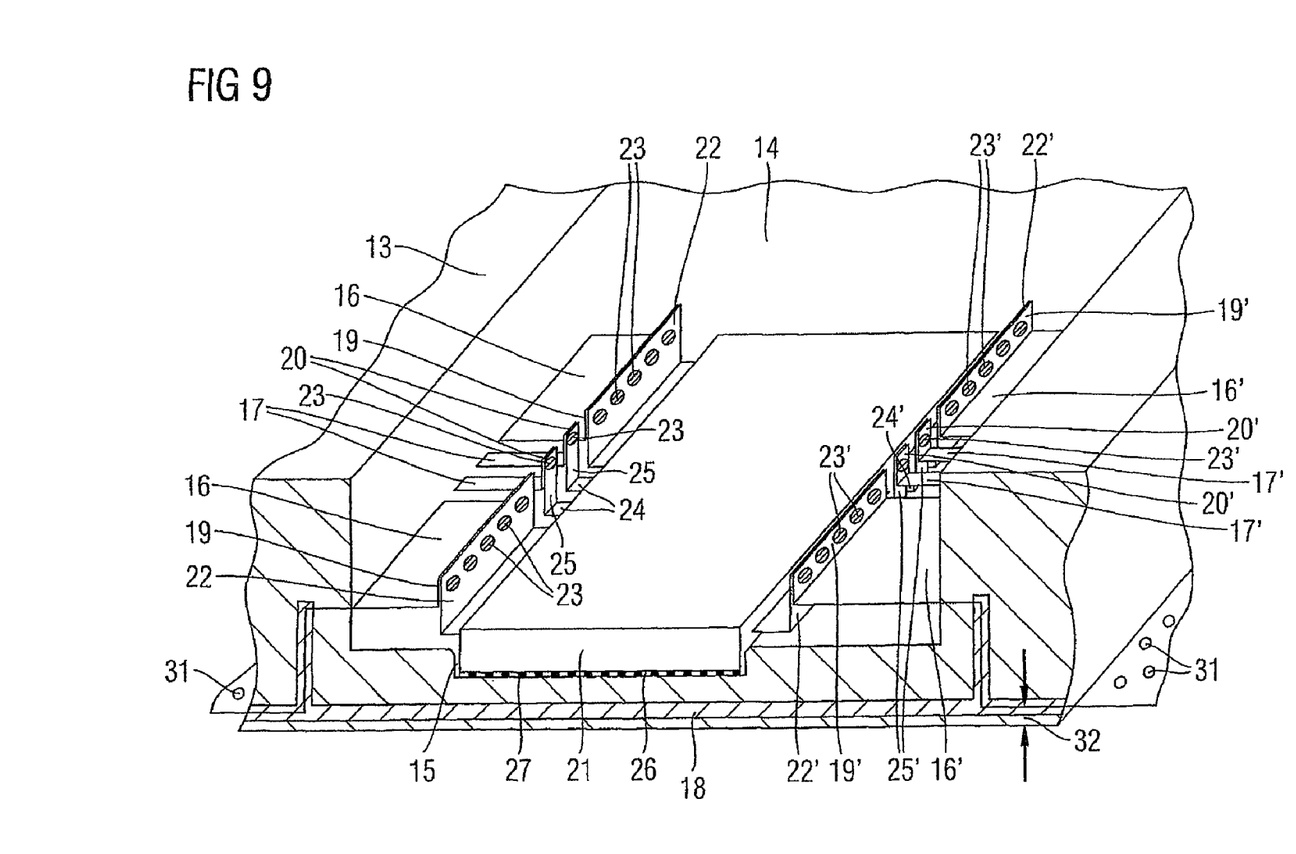
FIG. 9 shows a perspective view of a further exemplary embodiment.

The exemplary embodiments illustrated in FIGS. 7 to 9 show an approximately pot-like component 13 composed of an electrically insulating material, which is a plastic and may be an epoxy resin, a filler plastic or a thermosetting plastic.

The housing part 13 may be a housing cover of a housing of a butterfly valve for a motor vehicle.

A recessed cutout 15 having a rectangular cross section is formed at the base of the pot-like depression 14 of the component 13.

A leadframe comprising thermal contact plates 16, 16' and signal-carrying conductors 17, 17' is concomitantly injection-molded into the plastic.

In the case of the exemplary embodiment in FIG. 9, the leadframe was firstly provided with a preencapsulation 18 composed of plastic so as then to be encapsulated by injection-molding once again in a further work operation to form the component 13.

In each case two contact plates 16 and two conductors 17 project in a manner lying alongside one another from the side wall of the depression 14 of the component 13.

Opposite said two contact plates 16 and conductors 17, likewise two contact plates 16' and two conductors 17' project from a side wall of the depression 14 of the component 13.

The free ends of the contact plates 16, 16' which project into the depression 14 are bent away at right angles from the plane of the contact plates 16, 16' to form connection lugs 19, 19'.

In the same way, the free ends of the conductors 17, 17' which project into the depression 14 are also bent away at right angles from the plane of the conductors 17, 17' to form signal connection lugs 20, 20'.

Both the connection lugs 19, 19' and the signal connection lugs 20, 20' are directed toward the opening of the depression 14.

An integrated circuit having approximately the same cross-sectional contour as the receptacle 15 is inserted into the receptacle 15, and is connected to the bottom 27 of the receptacle 15 by means of a thermally conductive adhesive 26 in FIG. 9.

In the case of the exemplary embodiments of FIGS. 7 and 9, plate-like contact areas 4 are led out, parallel to the contact plates 16, 16', from the sides of the encapsulated integrated circuit 21 which face the contact plates 16, 16' and are bent away at right angles at their free ends in a manner directed toward the opening of the depression 14 to form mating connection lugs 22, 22'.

Each connection lug 19, 19' is assigned a mating connection lug 22, 22'. In this case, mutually assigned connection lugs 19, 19' and mating connection lugs 22, 22' have the same width, are directed in the same direction and bear on one another.

The mutually assigned connection lugs 19, 19' and mating connection lugs 22, 22' are electrically and thermally conductively connected to one another by a plurality of welding points 23.

In the same way as the mating connection lugs 22, 22', plate-like signal conductors 24, 24' are also led out from the integrated circuit and bent away to form signal mating connection lugs 25, 25', which bear on the signal connection lugs 20, 20' and are electrically conductively connected thereto by welding points 23'.

In the case of the exemplary embodiment in FIG. 8, plate-like contact areas 4' are present, which are bent to form a "U" in a manner corresponding to the receptacle 15 and are inserted into the receptacle 15.

The contact areas 4' are fixed to the bottom 27 of the receptacle 15 by means of a thermally conductive adhesive 26, a substrate 29 of the integrated circuit 21' likewise being fixed on the inner side of the "U" of the contact area 4' by means of a thermally conductive adhesive 28.

In this case, that part of the contact area 4' which bears on the bottom 27 forms an intermediate layer 30.

The two parallel limbs of the contact areas 4' form mating connection lugs 22, 22' which, as in the exemplary embodiments in FIGS. 7 and 9, bear on the connection lugs 19, 19' and are thermally conductively connected thereto by welding points 23, 23'.

Arranged on the substrate 29 is an integrated circuit 21' in the form of a hybrid circuit with conductor tracks (not illustrated), which also has a power semiconductor element alongside further electronic components.

Some of the conductor tracks (not illustrated) lead to the edge regions of the substrate 29 which are opposite the signal connection lugs 20, 20'. Plate-like signal conductors 24, 24' are soldered by one end thereof onto the ends of the conductor tracks of the substrate 29 which are respectively assigned to them.

The other ends of the signal conductors 24, 24' are bent away at right angles to form signal connection lugs 20, 20' and bear on the signal mating connection lugs 25, 25' which are respectively assigned to them and to which they are electrically conductively connected by welding points 23, 23'.

In the case of the exemplary embodiments in FIGS. 7 to 9, the regions of the contact plates 16, 16' which are arranged in the component 13 extend near the outer wall of the component 13, with the result that the majority of their area is covered by the electrically insulating material having only a small wall thickness 32 of approximately 1 to 1.5 mm. Good heat emission toward the outside is thereby possible.

For good connection of the contact plates 16, 16' to the electrically insulating material, a multiplicity of continuous cutouts 31 which are filled by the electrically insulating material are formed in the contact plates 16, 16'.

In the case of the exemplary embodiments in FIGS. 7 and 9, the contact plates 16, 16' serve both for heat dissipation and as electrical connection to plug pins (not illustrated), while in the case of the exemplary embodiment in FIG. 8, the contact plates 16, 16' serve only for heat dissipation.

Figure 10:
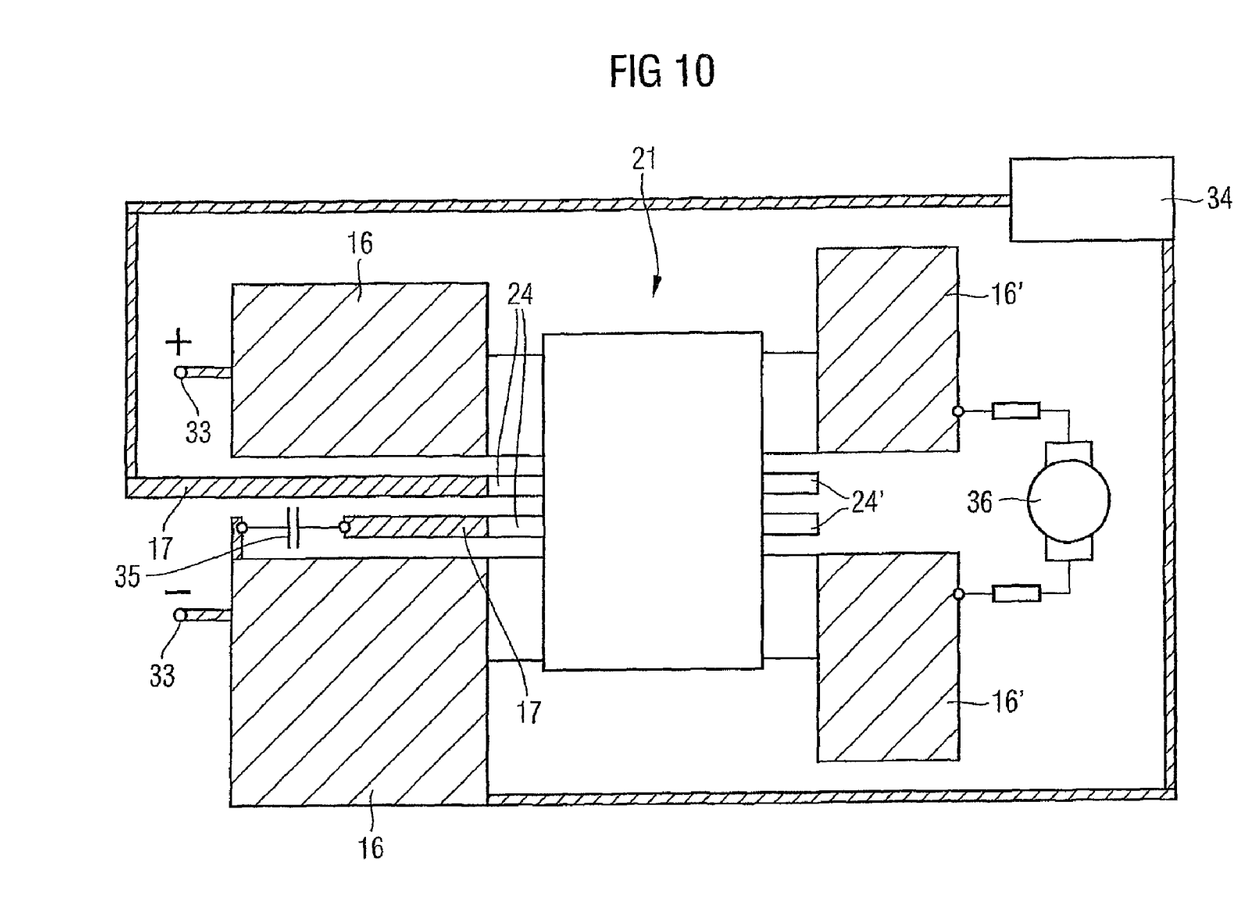
FIG. 10 shows a stylized plan view of a leadframe with connected circuit, motor and sensor.

FIG. 10 reveals the stylized plan view of a leadframe such as is used in the case of the exemplary embodiments in FIGS. 7 and 9.

In this case, the contact plates 16 have plug pins 33 and one of the conductors 17 leads to a position detection sensor 34.

A further conductor 17 leads to the voltage supply 35.

A DC motor 36 can be driven by the integrated circuit via the contact plates 16'.

The invention claimed is:

1. An electrical assembly comprising:
    an integrated circuit comprising at least one power semiconductor element and further electronic components;
    wherein the at least one power semiconductor element and the further electronic components are connected to one another and to connections by conductors formed by a leadframe;
    wherein the leadframe has a cooling area and parts used for electrical conduction;
    the cooling area is thermally conductively connected to a thermal contact area of the integrated circuit; and
    wherein the cooling area is formed as a thermal contact plate injection-molded into a component or cast into a component, and includes a free end having a bent portion that defines a connection lug;
    wherein the component is composed of an electrically insulating material and has a receptacle where the integrated circuit is inserted;
    wherein the thermal contact area of the integrated circuit is formed as a plate-like contact leading out from the integrated circuit and having bent portion that defines a mating connection lug;
    wherein at least one of the conductors formed by the leadframe has a bent portion that defines a signal connection lug;
    wherein a plate-like signal conductor leading out from the integrated circuit has a bent portion that defines a signal mating connection lug;
    wherein the connection lug of the cooling area bears on and is thermally conductively connected to the mating connection lug of the thermal contact area; and
    wherein the signal connection lug of the conductor bears on and is thermally conductively connected to the signal mating connection lug of the plate-like signal conductor.

2. The assembly according to claim 1, wherein at least one of the connection lug, the mating connection lug, the signal connection lug, and the signal mating connection extends away from a plane of a bottom of the receptacle.

3. The assembly according to claim 1, wherein at least 50% of the area of the thermal contact plate is covered with a wall thickness of the electrically insulating material of <3 mm.

4. The assembly according to claim 1, wherein the signal-carrying conductors of the leadframe are injection-molded or cast into the component composed of electrically insulating material, and the integrated circuit is inserted into the receptacle such that mutually assigned signal connection lug and signal mating connection lug bear on one another.

5. The assembly according to claim 1, wherein the integrated circuit bears with a boundary wall on a bottom of the receptacle.

6. The assembly according to claim 5, wherein the component composed of electrically insulating material has a wall thickness of <4 mm in a region of the bottom of the receptacle.

7. The assembly according to claim 5, wherein the integrated circuit bears on the bottom of the receptacle via an intermediate layer.

8. The assembly according to claim 7, wherein the intermediate layer comprises a thermally conductive adhesive, a thermally conductive adhesive film or a thermally conductive paste.

9. The assembly according to claim 3, wherein the thermal contact plate is provided with a cutout or a plurality of continuous cutouts in a region enclosed by the electrically insulating material.

10. The assembly according to claim 1, wherein the cooling area is fixedly connected to the thermal contact area at least two opposite edges, and wherein an area region of the cooling area that bears on the thermal contact area is prestressed against the thermal contact area.

11. The assembly according to claim 1, wherein the assembly including the leadframe is encapsulated.

12. The assembly according to claim 1, wherein the cooling area is at least partially not encapsulated.

13. The assembly according to claim 1, wherein the cooling area is at least partially encapsulated with a thinner layer than one or more other parts of the assembly.

14. The assembly according to claim 1, wherein the further electronic components form an application specific integrated circuit.

15. The assembly according to claim 1, wherein a sensor is connected with the conductors formed by the leadframe.

16. The assembly according to claim 1, wherein the at least one power semiconductor element and the integrated circuit are integrated in a common housing.

17. The assembly according to claim 1, wherein the leadframe is mounted in an electrically insulating holding frame.

18. The assembly according to claim 1, wherein parts of the leadframe are embodied as electrical plug connections.

19. The assembly according to claim 1, wherein a thermally conductive intermediate layer is applied between the thermal contact area and a region of the leadframe that touches said thermal contact area.

20. The assembly according to claim 1, wherein the connection lug is connected to the mating connection lug and/or the signal connection lug is connected to the signal mating connection lug by welding.

21. The assembly according to claim 1, wherein the connection lug is connected to the mating connection lug by means of electrically and/or thermally conductive adhesive.

22. The assembly according to claim 1, wherein the signal connection lug is connected to the signal mating connection lug by means of an electrically conductive adhesive.

23. The assembly according to claim 1, wherein the integrated circuit is a plastic-encapsulated power semiconductor element or a hybrid circuit that is arranged on a substrate and has power semiconductor elements.

24. The assembly according to claim 23, wherein the substrate is a ceramic substrate or an insulated metal substrate or an epoxy printed circuit board, and wherein the power semiconductor element and electronic components are soldered or thermally conductively adhesively bonded the substrate.

* * * * *